United States Patent
Hjelm et al.

(10) Patent No.: US 7,737,730 B2
(45) Date of Patent: Jun. 15, 2010

(54) METHOD OF DETECTING THE FREQUENCY OF AN INPUT CLOCK SIGNAL OF AN INTEGRATED CIRCUIT AND INTEGRATED CIRCUIT

(75) Inventors: Mikael Hjelm, Vaesteras (SE); Charlotta Hedenaes, Danderyd (SE); Bjoern Wiklund, Upplands Vaesby (SE)

(73) Assignee: Infineon Technologies AG, Neubiberg (DE)

( * ) Notice: Subject to any disclaimer, the term of this patent is extended or adjusted under 35 U.S.C. 154(b) by 13 days.

(21) Appl. No.: 11/848,431

(22) Filed: Aug. 31, 2007

(65) Prior Publication Data

US 2009/0058468 A1     Mar. 5, 2009

(51) Int. Cl.
*G01R 23/02* (2006.01)
*H03D 3/00* (2006.01)
*H03K 9/06* (2006.01)

(52) U.S. Cl. ............... 327/47; 327/39; 327/423; 327/494; 327/508; 327/588

(58) Field of Classification Search ......... 327/108–112, 327/379, 389, 391, 39–49, 92, 423–424, 327/494, 508, 587, 588; 326/22–27, 82, 326/83, 86
See application file for complete search history.

(56) References Cited

U.S. PATENT DOCUMENTS

| 3,794,853 | A | 2/1974 | Zwarenstein |
| 4,677,322 | A | 6/1987 | Burson et al. |
| 6,043,749 | A | 3/2000 | Saito et al. |
| 6,344,768 | B1 * | 2/2002 | Daun-Lindberg et al. ... 327/424 |
| 6,644,127 | B1 * | 11/2003 | Matzen .................. 73/861.12 |
| 6,813,110 | B2 * | 11/2004 | Leighton et al. ............. 360/68 |
| 2005/0088855 | A1 * | 4/2005 | Kirchmeier et al. .......... 363/17 |

FOREIGN PATENT DOCUMENTS

| JP | 407222477 A | * | 8/1995 |
| WO | WO 86/01356 | | 2/1986 |

* cited by examiner

*Primary Examiner*—Lincoln Donovan
*Assistant Examiner*—Brandon S Cole
(74) *Attorney, Agent, or Firm*—Slater & Matsil, L.L.P.

(57) ABSTRACT

An integrated circuit includes a first switched capacitor element and a second switched capacitor element, which are coupled to form a bridge circuit, the first switched capacitor element being located in a first branch of the bridge circuit and the second switched capacitor element being located in a second branch of the bridge circuit. A detector circuit is coupled to the first branch and to the second branch of the bridge circuit. Switching signals of the first switched capacitor element and of the second switched capacitor element are generated on the basis of an input clock signal of the integrated circuit.

25 Claims, 3 Drawing Sheets

METHOD OF DETECTING THE FREQUENCY OF AN INPUT CLOCK SIGNAL OF AN INTEGRATED CIRCUIT AND INTEGRATED CIRCUIT

TECHNICAL FIELD

An embodiment of the present invention generally relates to a method of detecting the frequency of an input clock signal of an integrated circuit and to an integrated circuit configured to detect the frequency of its input clock signal.

BACKGROUND

In some types of integrated circuits, such as integrated circuits used in communication applications, there may be a need to discriminate between different frequencies of an input clock signal supplied to the integrated circuit. In this respect, it is known to use programming, e-fuses, clock specific programs or specific signals which are supplied from the outside to the integrated circuit to indicate which frequency of the input clock signal is used. For example, a signal supplied to a dedicated input pin of the integrated circuit may be used to indicate which one of a high frequency and a low frequency is used. The integrated circuit may use this information to adjust its internal operations. However, this known approach has the problem of a low flexibility or of requiring additional processing so as to adopt the integrated circuit to the specific frequency of the input clock signal.

SUMMARY OF THE INVENTION

According to embodiments of the present invention, integrated circuits and methods are provided, in which the frequency of an input clock signal of the integrated circuit can be detected by means of a bridge circuit. The bridge circuit comprises a first switched capacitor element located in a first branch of the bridge circuit and a second switched capacitor element located in a second branch of the bridge circuit. Switching signals of the first switched capacitor element and of the second switched capacitor element are obtained on the basis of the input clock signal.

BRIEF DESCRIPTION OF THE DRAWINGS

For a more complete understanding of embodiments of the present invention, and the advantages thereof, reference is now made to the following descriptions taken in conjunction with the accompanying drawings, in which.

DETAILED DESCRIPTION OF ILLUSTRATIVE EMBODIMENTS

The following detailed description explains exemplary embodiments of the present invention. The description is not to be taken in a limiting sense, but is made only for the purpose of illustrating general principles of the invention. The scope of the invention, however, is only defined by the claims and is not intended to be limited by the exemplary embodiments described hereinafter.

It is to be understood that in the following detailed description any shown or described direct connection or coupling between two functional blocks, devices, components, or other physical or functional units could also be implemented by indirect connection or coupling.

In the following, embodiments of the invention will be described with reference to the accompanying drawings. The embodiments relate to an interface circuit and a method of determining the frequency of an input clock signal of the integrated circuit. The integrated circuit may be configured to perform specific functions in an electronic device, such as in a communication device. For example, the integrated circuit may implement functions of a wireless telephone, of a mobile telephone or of other types of communication devices. Such types of integrated circuits are generally provided with clock signal inputs. Typically, these clock signal inputs are supplied with input clock signals having a specific frequency. However, in some cases the integrated circuits may be used in different application environments which in turn require different frequencies of the input clock signal.

Figure 1:
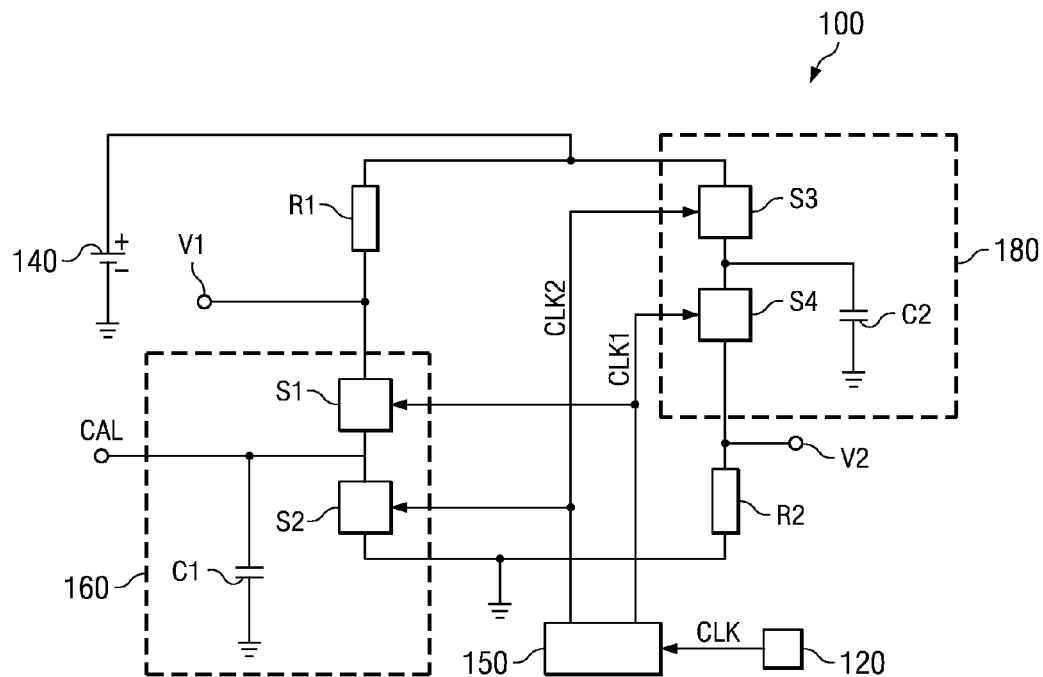
FIG. 1 schematically illustrates a bridge circuit provided in an integrated circuit according to an embodiment of the invention.

FIG. 1 schematically illustrates a portion of an integrated circuit according to an embodiment of the invention. The integrated circuit is provided with an internal bridge circuit 100 for determining the frequency of an input clock signal CLK of the integrated circuit. The input clock signal CLK is received via a clock signal input 120 of the integrated circuit. The integrated circuit further comprises a switching signal generator 150 which receives the input clock signal CLK and generates therefrom switching signals to be used in the bridge circuit 100. In FIG. 1, the switching signals are designated by CLK1 and CLK2. It is to be understood, that the input clock signal CLK is also supplied to other components of the integrated circuit, e.g., to be used as a system clock or the like. For the sake of clarity, these other structures of the integrated circuit are not illustrated in FIG. 1.

As illustrated, the bridge circuit 100 comprises a first branch formed of a first resistor R1 and a first switched capacitor element 160 connected in series, and a second branch formed of a second switched capacitor element 180 and a second resistor R2 connected in series. The first and the second branch of the bridge circuit are connected in parallel between a high and a low DC supply voltage. The DC supply voltage is provided by a DC voltage source 140. In the illustrated example the low DC supply voltage corresponds to ground. In other embodiments, the supply voltage may be selected in a different way.

In the first branch of the bridge circuit 100, a measuring node is formed between the first resistor R1 and the first switched capacitor element 160. A voltage level at the first measuring node is denoted by V1. In the second branch of the bridge circuit 100, a second measuring node is formed between the second switched capacitor element 180 and the second resistor R2. A voltage level at the second measuring node is denoted by V2.

As illustrated, the bridge circuit 100 corresponds to an electrical circuit in which a current path, from the high DC supply voltage to the low DC supply voltage, splits into two parallel branches and then recombines into a single current path, thereby enclosing a loop.

In the illustrated embodiment, the first switched capacitor element 160 comprises a first switch S1, a second switch S2, and a first capacitor C1 which is coupled with one of its terminals to a node between the first switch S1 and the second switch S2. The other terminal of the first capacitor C1 is coupled to the low supply voltage. The first switch S1 is arranged to selectively couple the first capacitor C1 to a terminal of the first switched capacitor element 160 with respect to the first resistor R1. The second switch S2 is arranged to selectively couple the first capacitor C1 to a terminal of the switched capacitor element 160 with respect to the low DC supply voltage. First capacitor C1 may be further coupled to signal CAL, which is coupled to a calibration circuit. Alternatively, signal CAL may be coupled to second capacitor C2 or omitted if calibration is not implemented.

As further illustrated, the second switched capacitor element 180 comprises a third switch S3, a fourth switch S4, and a second capacitor C2 coupled with one of its terminals to a node between the third switch S3 and the fourth switch S4. The other terminal of the second capacitor C2 is coupled to the low supply voltage. The third switch S3 is arranged to selectively couple the second capacitor C2 to a terminal of the second switched capacitor element 180 with respect to the high DC supply voltage. The fourth switch S4 is arranged to selectively couple the second capacitor C2 to a terminal of the second switched capacitor element 180 with respect to the second resistor R2.

As mentioned above, the first switched capacitor element 160 and the second switched capacitor element 180 are driven on the basis of the switching signals CLK1 and CLK2. In the first switched capacitor element 160, the first switching signal CLK1 controls the first switch S1, and the second switching signal CLK2 controls the second switch S2. In the second switched capacitor element, the first switching signal CLK1 controls the fourth switch S4, and the second switching signal CLK2 controls the third switch S3. In other embodiments, the allocation of the first switching signal CLK1 and the second switching signal CLK2 within the first switched capacitor element 160 or the second switched capacitor element 180 may be reversed.

The switching signal generator 150 is configured to generate the first switching signal CLK1 and the second switching signal CLK2 on the basis of the input clock signal CLK such that the first switching signal CLK1 and the second switching signal CLK2 are clock pulse signals which are non-overlapping with respect to each other and have a frequency which is controlled by the frequency of the input clock signal CLK. According to an embodiment, this is accomplished by generating the first switching signal CLK1 and the second switching signal CLK2 as biphase clock signals on the basis of the input clock signal. This is further illustrated in FIG. 2.

Figure 2:
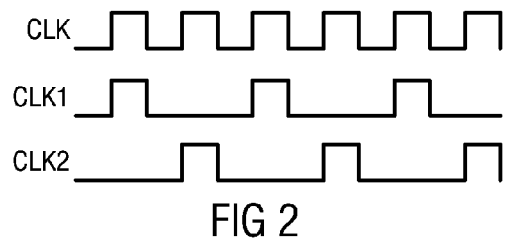
FIG. 2 illustrates the generation of switching signals on the basis of an input clock signal of the integrated circuit of FIG. 1.

As illustrated in FIG. 2, the input clock signal CLK forms a train of equidistant clock pulses. The same applies to the first switching signal CLK1 and the second switching signal CLK2. However, only every second pulse of the input clock signal CLK is present in the first switching signal CLK1 and in the second switching signal CLK2. In particular, those pulses of the input clock signal CLK which are present in the first switching signal CLK1 are left out in the second switching signal CKL2 and vice versa. Thereby, the first switching signal CLK1 and the second switching signal CLK2 are phase shifted with respect to each other by one clock cycle of the input clock signal. As the pulse width of the clock pulses in the first switching signal CLK1 and in the second switching signal CLK2 is the same as in the input clock signal CLK, this ensures that the clock pulses in the first switching signal CLK1 and in the second switching signal CLK2 are non-overlapping, with respect to each other. In other embodiments, non-overlapping clock pulse signals may be generated in a different manner, e.g., using phase-shifting and/or frequency division techniques.

With regards to the structure of the first switched capacitor element 160 and of the second switched capacitor element 180 as illustrated in FIG. 1, the non-overlapping character of the first switching signal CLK1 and of the second switching signal CLK2 means that only one of the first switch S1 and of the second switch S2 is controlled to be open at the same time, and that only one of the third switch S3 and of the fourth switch S4 is controlled to be open at the same time. In this way, the first switch S1, the second switch S2, the third switch S3, and the fourth switch S4, in connection with the first capacitor C1 and the second capacitor C2, control the flow of charge from the high DC supply voltage to the low DC supply voltage. This mimics the DC behavior of a resistor. The amount of charge transferred for time depends on the switching frequency, i.e., on the frequency of the input clock signals CLK. Accordingly, the first switched capacitor element 160 and the second switched capacitor element 180 each mimic a resistor having a resistance value which depends on the frequency of the input clock signal. In accordance with the change in the resistance value, the voltage levels V1, V2 in the first measuring node and in the second measuring node become unbalanced. According to an embodiment, the voltage levels V1, V2 in the first and second measuring nodes are used as a basis for detecting the frequency of the input clock signal. It is to be noted, that if the frequency of the input clock signal CLK is known, the voltage levels V1, V2 in the first and second measuring nodes could also be used as a basis for determining the values of the resistors and the capacitors of the bridge circuit 100.

Figure 3:
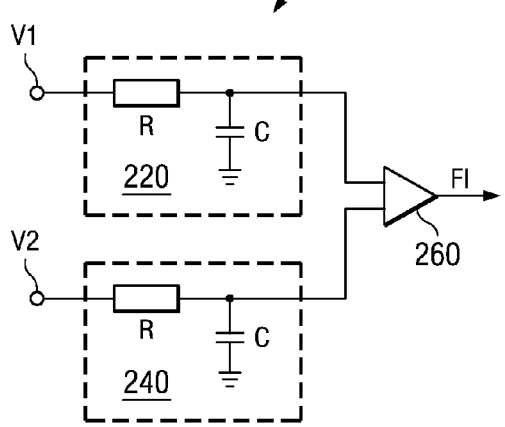
FIG. 3 schematically illustrates a detector circuit according to an embodiment of the invention.

In FIG. 3, an implementation of a detector circuit 200 is illustrated which can be used in an integrated circuit according to an embodiment of the invention to evaluate the voltage levels V1, V2 in the first and second measuring nodes of the bridge circuit 100. As illustrated, the detector 200 comprises a first low-pass type filter 220 which is coupled to the first measuring node, i.e. is supplied with the first voltage level V1, and a second low-pass type filter 240 which is coupled to the second measuring node, i.e., is supplied with the second voltage level V2. The low-pass type filters 220, 240 are each implemented as RC-filters comprising a resistor R and a capacitor C. In other embodiments, other implementations of the filters may be used.

The detector circuit 200 further comprises a comparator 260 to which the filtered output signals of the first and second low-pass type filters 220, 240 are supplied. On the basis of a comparison between its input signals, the comparator 260 generates at its output a frequency information signal FI.

According to an embodiment, the frequency information signal FI may be generated to have either a high or a low value depending on whether the first voltage V1 or the second voltage level V2 has a larger value. As regards the frequency of the input clock signal CLK, this type of frequency information signal FI can be used to detect whether the frequency of the input clock signal CLK is above or below a specific threshold value. The threshold value can be adjusted by dimensioning the components of the bridge circuit, i.e., the first and second capacitors C1, C2, and the first and second resistors R1, R2.

In other embodiments, a different scheme may be adopted when generating the frequency information signal FI. For example, the frequency information signal FI may be generated so as to be proportional to the deviation of the frequency of the input clock signal CLK from a nominal value. Further, multiple frequency ranges may be defined, and the frequency information signal FI may be generated so as to indicate in which one of the frequency ranges the frequency of the input clock signal CLK falls, e.g., by using a multi-comparator arrangement.

Figure 4:
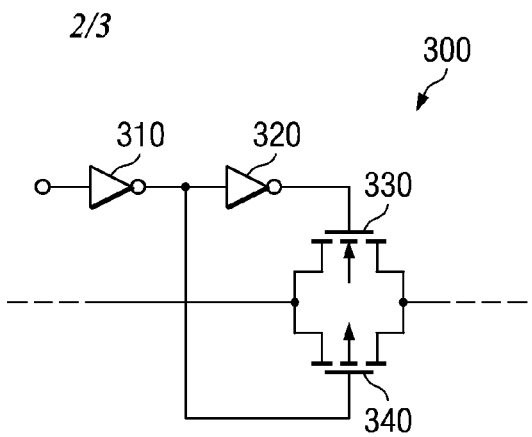
FIG. 4 schematically illustrates the implementation of switches according to an embodiment of the invention.

FIG. 4 schematically illustrates an implementation of a switch 300 which may be used in an integrated circuit according to an embodiment of the invention within the first and second switched capacitor elements 160, 180 of the bridge circuit 100 as illustrated in FIG. 1. In particular, FIG. 4 illustrates an implementation of a switch 300 which corresponds to a bilateral CMOS switch. The switch 300 may be used as the first switch S1, the second switch S2, the third switch S3, or the fourth switch S4 of FIG. 1.

As illustrated, the switch 300 comprises a first inverter 310 to which the switching signal CLK1/CLK2 is supplied. The output signal of the first inverter 310 is supplied to a second inverter 320. The switch 300 further comprises a first MOS transistor 330 and a complementary second MOS 340. The output signal of the second inverter is used as a control signal for the first MOS transistor, and the output signal of the first inverter 310 is used as a control signal for the complementary second MOS transistor 340. By this means, a current path through the source and drain terminals of the first MOS transistor 330 and the complementary second MOS transistor 340 is simultaneously opened or closed depending on the status of the switching signal CLK1/CLK2.

According to an embodiment, the integrated circuit may further comprise a capacitor calibration circuit for calibrating internal capacitors of the first or second switched capacitor elements 160, 180 with respect to an external capacitor. In this respect, an internal capacitor refers to a capacitor which is formed within the integrated circuit and an external capacitor refers to a capacitor which can be externally connected to the integrated circuit.

Figure 5:
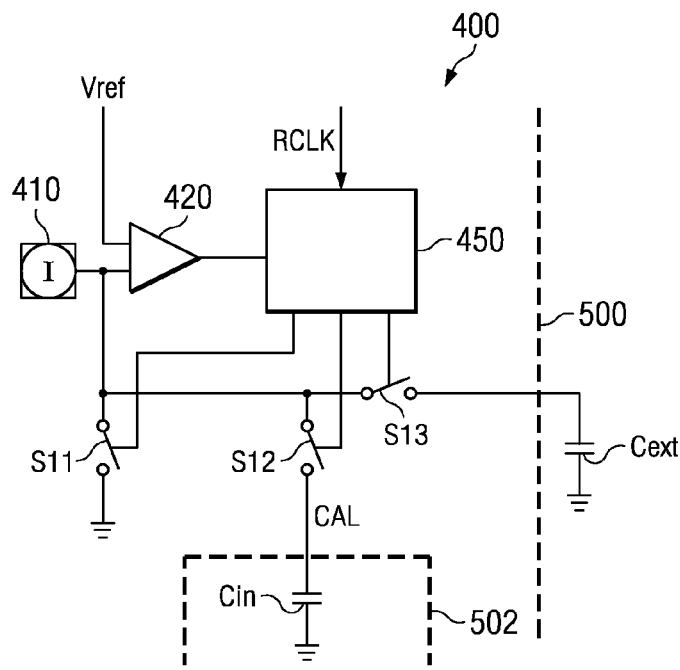
FIG. 5 schematically illustrates a calibration circuit according to an embodiment of the invention.

FIG. 5 schematically illustrates a capacitor calibration circuit 400 according to an embodiment of the invention. In FIG. 5, an internal capacitor is designated by Cint, and an external capacitor is designated by Cext. As mentioned above, the internal capacitor Cint may correspond to the first capacitor C1 or to the second capacitor C2 as illustrated in FIG. 1, as represented by dashed line 502. which separates Cint from the rest of the calibration circuit. In embodiments, Cint or corresponding capacitors C1 and/or C2 are coupled to switch S12 via signal CAL. The external capacitor Cext may be a capacitor of well-known value which is externally connected to the integrated circuit. For example, the external capacitor Cext may be a supply capacitor connected to a supply input of the integrated circuit. In this case, no additional external connection of the integrated circuit is required. Typically, supply capacitors as used for decoupling can be selected with sufficient precision to be used as external reference capacitors. In FIG. 5, a chip edge is illustrated by a dashed line 500, which separates internal components of the integrated circuit on the left side of the figure from external components on the right side of the figure.

As illustrated, the capacitor calibration circuit 400 comprises a current source 410 to be selectively coupled to the internal capacitor Cint or to the external capacitor Cext so as to charge the internal capacitor Cint or the external capacitor Cext with an output current of the current source 410. Further, the internal capacitor Cint and the external capacitor Cext can be selectively coupled to the low supply voltage, i.e., to ground, so as to discharge the capacitor.

For monitoring charging of the capacitor, the capacitor calibration circuit 400 further comprises a monitoring device 420 which can be selectively coupled with one of its inputs to the internal capacitor Cint or to the external capacitor Cext. The other input of the monitoring device 420 is supplied with a reference voltage Vref. The reference voltage Vref may be provided by a known type of reference voltage source. The monitoring device 420 may be implemented on the basis of a comparator.

Further, the capacitor calibration circuit 400 comprises an evaluation device 450, which is supplied with the output signal of the monitoring device 420 and with a reference clock signal RCLK. The reference clock signal RCLK may be generated by a known type of clock signal source. As explained in the following, the evaluation device 450 may be implemented on the basis of a counter.

For selectively coupling and decoupling the internal capacitor Cint and the external capacitor Cext with respect to the current source 410, the monitoring device 420, and the low supply voltage, the capacitor calibration circuit 400 comprises switches S11, S12, and S13 which are controlled by the evaluation device 450. By controlling the switches S11, S12, S13, the evaluation device 450 controls the calibration process.

According to an embodiment of the invention, the calibration process is as follows:

First, the switches S11 and S12 are closed until the internal capacitor Cint has discharged. The time for discharging the internal capacitor Cint can be controlled by counting a corresponding number of clock cycles of the reference clock signal RCLK.

Then, the switch S11 is opened, and the evaluation device 450 starts counting of clock cycles of the reference clock signal RCLK. At this stage, the internal capacitor Cint is charged by the output current of the current source 410. The voltage level at the terminal of the internal capacitor is monitored by means of the monitoring device 420, which compares the voltage level to the reference voltage Vref.

Next, when the monitoring device 420 indicates that the voltage level at the terminal of the internal capacitor Cint has reached the reference voltage Vref, a corresponding output signal of the monitoring device 420 stops the counting of the evaluation device 450. At this point, the counted value corresponds to a first period of time to charge the internal capacitor Cint to the reference voltage level Vref. This counter value is stored by the evaluation device 450.

Next, the switches S11 and S13 are closed and the switch S12 is opened so as to discharge the external capacitor Cext. As mentioned above, this could be accomplished on the basis of counting a suitable number of clock cycles of the reference clock signal RCLK.

Then, the switch S11 is opened, and the evaluation device 450 starts counting clock cycles of the reference clock RCLK. At this stage, the output current of the current 410 charges the external capacitor Cext. The voltage level at the external capacitor Cext is monitored by the monitoring device 420, which compares the voltage level to the reference voltage Vref.

When the monitoring device 420 indicates that the voltage level has reached Vref, a corresponding output signal of the monitoring device 420 causes the evaluation device 450 to stop counting. At this point, the counted value corresponds to a second period of time to charge the external capacitor to the reference voltage level Vref.

Next, the ratio of the counted value when charging the internal capacitor Cint and the counted value when charging the external capacitor Cext, i.e., the ratio of the first period of time and the second period of time, is calculated. This ratio corresponds to the capacitance ratio between Cint and Cext.

According to an embodiment of the invention, the above ratio obtained as the result of the calibration process is used as a basis for adjusting the internal capacitor Cint. For this purpose, the internal capacitors C1 and C2 of the bridge circuit 100 as illustrated in FIG. 1 are implemented as adjustable capacitors. The adjustable capacitors C1 and C2 may be implemented using a known technique, such as varactor diodes or switched capacitor banks. In other embodiments, the results of the calibration process may be used in a different manner. For example, the resistors in the bridge circuit 100 as illustrated in FIG. 1 may be adjusted. Further, the result of the calibration process may be used at the level of evaluating the voltage levels V1, V2. For example, an offset voltage could be added within the comparator 260 as illustrated in the detector circuit 200 of FIG. 3.

As the capacitor calibration circuit 400 uses a common current source 410 for charging both the internal capacitor Cint and the external capacitor Cext, a common monitoring device 420 and a common reference voltage Vref for monitoring the voltage level at both the internal capacitor Cint and the external capacitor Cext, the calibration process is not sensitive with respect to process variations of these components.

Figure 6A:
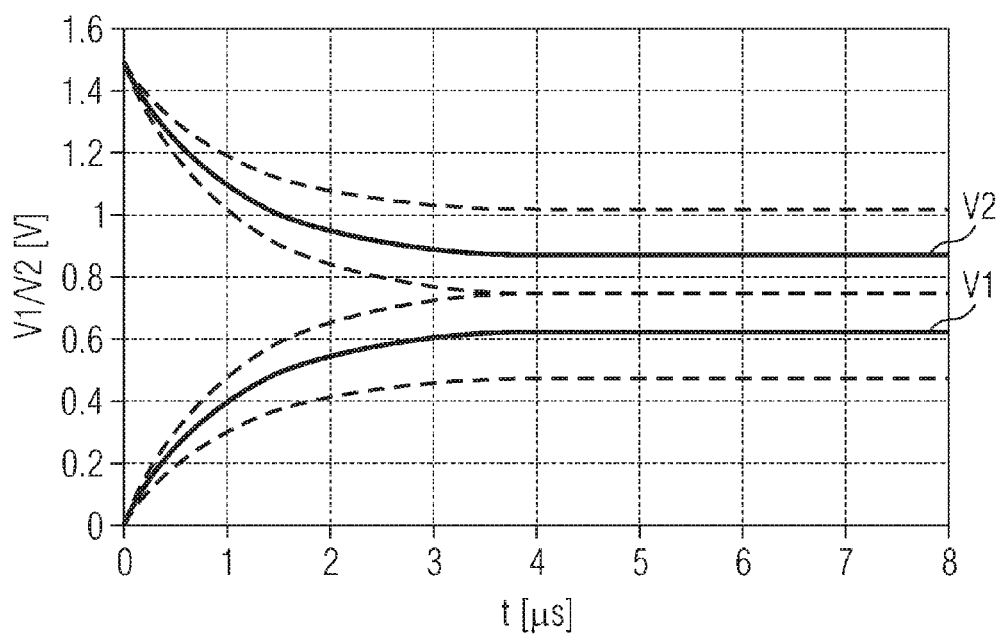
FIGS. 6(a) and 6(b), referred to collectively as FIG. 6, schematically illustrate the course of voltage signals in the bridge circuit of FIG. 1.
Figure 6B:
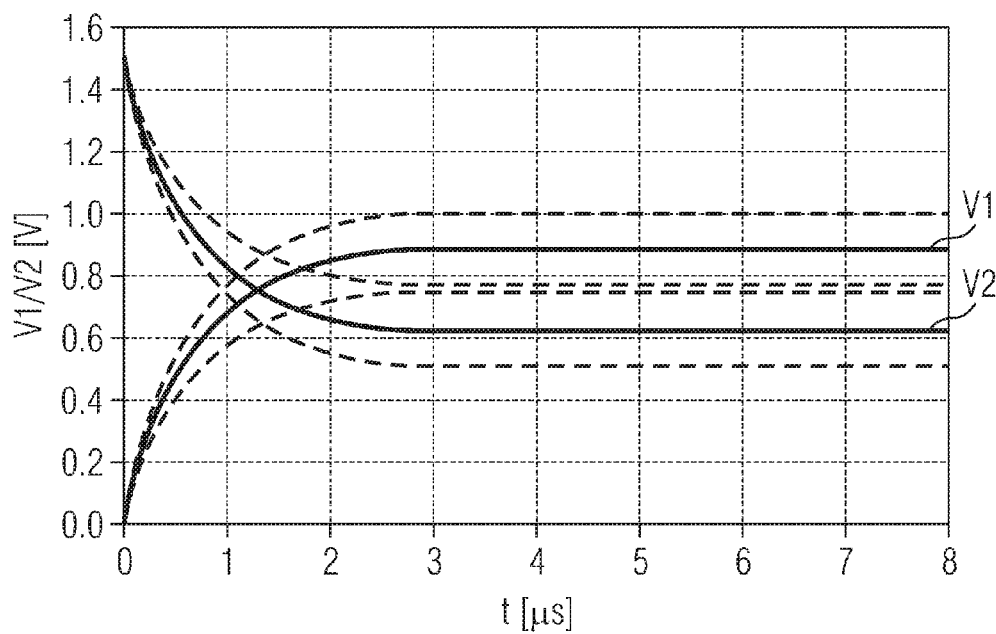

FIG. 6 shows exemplary courses of the voltage levels V1, V2 at the first and second measuring nodes of the bridge circuit 100 of FIG. 1. In the illustration, a ripple of the curves due to the switching activity is not illustrated. This ripple can be smoothed out by the low-pass type filters in the detector circuit as illustrated in FIG. 3. Further, it is possible to include capacitors between the first measuring node and ground and between the second measuring node and ground. According to an embodiment, these capacitors can be selected to have a larger capacitance than the first capacitor C1 and the second capacitor C2. In FIG. 6(a), the frequency of the input clock signal CLK is 10 MHz. In FIG. 6(b), the frequency of the input clocks CLK is 20 MHz. For nominal values of the capacitances and the resistances in the bridge circuit 100, the signal is denoted by a solid line. The additional shaded lines illustrate the effect of deviations from the nominal values due to process variation during manufacture of the integrated circuit.

As can be seen in FIGS. 6(a) and 6(b), after activating the circuit, the voltage levels V1, V2 in the first and second measuring nodes of the bridge circuit 100 will approach a constant value, the approaching rate depending on the value of the capacitors C1 and C2 on the frequency of the input clock signal CLK, and on an additional capacitance, e.g., due to the low-pass type filters in the detector circuit 200 of FIG. 3. In case of FIG. 6(a), the voltage level V1 in the first measuring node approaches a value which is lower than the approach value for the voltage level V2 in the second measuring node. In the case of FIG. 6(b), the voltage level V1 in the first measuring node approaches a value which is larger than the value for the voltage level V2 in the second measuring node. Accordingly, by comparing the voltage levels V1 and V2 after a suitable period of time, it can be distinguished between the situation of FIG. 6(a) in which the frequency of the input clock signal CLK is 10 MHz, and the situation of FIG. 6(b), in which the frequency of the input clock signal CLK is 20 MHz.

As can be taken from the shaded lines in FIGS. 6(a) and (b), process variations may cause the comparison between the voltage levels V1, V2 to deliver inaccurate or insufficient results. This may be avoided by redimensioning the components of the bridge circuit 100 or by calibrating the capacitors C1, C2 with respect to an external capacitor as explained in connection with FIG. 5.

Figure 7:
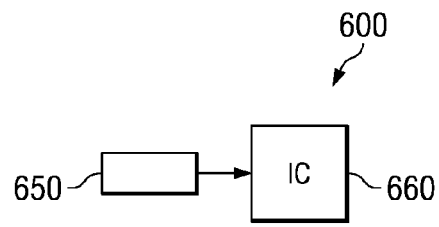
FIG. 7 schematically illustrates an electronic device comprising an integrated circuit according to an embodiment of the invention.

Finally, FIG. 7 schematically illustrates an electronic device 600 in which an integrated circuit according to one of the above embodiments is used. In FIG. 7, the integrated circuit is designated by reference numeral 660. The integrated circuit receives an input clock signal CLK from a clock signal source 650. Typically, the clock signal source 650 is a further component of the electronic device 600. For example, the clock signal source 650 may be a further integrated circuit which communicates with the integrated circuit 660. In other examples, the clock signal source 650 may be an oscillator circuit or the like.

In the electronic device 600, the integrated circuit 660 receives the input clock signal CLK via its clock signal input and detects the frequency of the input clock signal CLK. The operation of the integrated circuit 660 is controlled on the basis of the detected frequency. For example, the integrated circuit 660 may be provided with at least two different operating modes, each corresponding to a different frequency of the input clock signal CLK. Having detected the frequency of the input clock signal CLK, the integrated circuit 660 selects its operating mode on the basis of the detected frequency. In this way, the integrated circuit 660 can be used in a flexible way in different circuit environments.

Although in the foregoing embodiments of the invention have been described in relation to integrated circuits as used in communication devices, the invention is not limited thereto. In particular, the concepts as explained above may be applied to any type of integrated circuit in which knowledge of the frequency of an input clock signal is required.

Further, the embodiments as explained above may be subjected to various modifications. For example, the bridge circuit as illustrated in FIG. 1 could also be implemented by using additional switched capacitor elements rather than resistors. Different implementations are possible for the switched capacitor elements. The detector circuit as illustrated in FIG. 3 could use different types of filters, either analog or digital. Further, it is to be understood that some of the illustrated components could be implemented either in hardware or in software running on a processing unit of the integrated circuit. For example, functions of the detector circuit or of the capacitor calibration circuit, in particular of the monitoring device and/or of the evaluation device, could be implemented in software. Finally, it is to be understood that features of different embodiments could be combined with each other as appropriate.

What is claimed is:
1. An integrated circuit, comprising:
a first switched capacitor element;
a second switched capacitor element;
the first switched capacitor element and the second switched capacitor element being coupled to form a bridge circuit, the first switched capacitor element being located in a first branch of the bridge circuit, and the second switched capacitor element being located in a second branch of the bridge circuit;
a detector circuit coupled to the first branch and to the second branch of the bridge circuit; and
a clock signal input is coupled to the first switched capacitor element and to the second switched capacitor element to obtain switching signals of the first switched capacitor element and of the second switched capacitor element based on an input clock signal applied to the clock signal input, wherein the detector is configured to discriminate between at least a first frequency of the input clock signal and a second frequency of the input clock signal and to generate a corresponding frequency information signal, and the frequency information signal is based on a first voltage level in the first branch of the bridge circuit and a second voltage level in the second branch of the bridge circuit.

2. The integrated circuit according to claim 1, wherein the bridge circuit further comprises a first resistor located in the first branch and coupled in series to the first switched capacitor element, and a second resistor located in the second branch and coupled in series to the second switched capacitor element.

3. The integrated circuit according to claim 1, wherein the detector circuit comprises at least one low pass type filter coupled to a comparator.

4. The integrated circuit according to claim 1, further comprising:
- a switching signal generator coupled between the clock signal input and the first switched capacitor element and the second switched capacitor element,
- wherein the switching signal generator is configured to generate the switching signals as at least two clock pulse signals that are non-overlapping with respect to each other.

5. The integrated circuit according to claim 1,
- wherein the first switched capacitor element comprises a first switch, a second switch and a first capacitor coupled to a node between the first switch and the second switch, and
- wherein the second switched capacitor element comprises a third switch, a fourth switch, and a second capacitor coupled to a node between the third switch and the fourth switch.

6. The integrated circuit according to claim 1, further comprising:
- a capacitor calibration circuit to be coupled to an external capacitor and to an internal capacitor of the first switched capacitor element or of the second switched capacitor element.

7. The integrated circuit according to claim 6, wherein the capacitor calibration circuit comprises:
- a current source selectively coupled to the internal capacitor or the external capacitor;
- a monitoring device selectively coupled to the internal capacitor or to the external capacitor and configured to compare a voltage level at a terminal of the respectively connected internal or external capacitor with a reference voltage; and
- an evaluation device supplied with an output signal of the monitoring device and configured to measure a period of time until the voltage level on the terminal of the respectively connected capacitor reaches the reference voltage.

8. The integrated circuit according to claim 6, wherein the external capacitor is a supply capacitor coupled to a supply input of the integrated circuit.

9. The integrated circuit according to claim 1, wherein the integrated circuit is provided with at least a first operating mode corresponding to the first frequency and a second operating mode corresponding to the second frequency, and
- wherein the integrated circuit is configured to select between the at least first and second operating mode based on the frequency information signal.

10. A method of detecting the frequency of an input clock signal of an integrated circuit, the method comprising:
- generating switching signals of a first switched capacitor element provided in a first branch of a bridge circuit and of a second switched capacitor element provided in a second branch of the bridge circuit based on the input clock signal; and
- obtaining a frequency information signal based on a first voltage level in the first branch of the bridge circuit and a second voltage level in the second branch of the bridge circuit, wherein the frequency information signal discriminates between at least two frequencies of the input clock signal.

11. The method according to claim 10, further comprising:
- obtaining the frequency information signal based on a comparison between the first voltage level and the second voltage level.

12. The method according to claim 10, wherein the switching signals are generated as at least two clock pulse signals which are non-overlapping with respect to each other.

13. The method according to claim 12, further comprising:
- generating the two clock pulse signals as biphase clock signal based on the input clock signal.

14. The method according to claim 10, further comprising:
- calibrating an internal capacitor of the first switched capacitor element and/or of the second switched capacitor element with respect to an external capacitor.

15. The method according to claim 14, wherein calibrating comprises selectively coupling the internal capacitor and the external capacitor to a common current source or to a common monitoring device.

16. The method according to claim 15, further comprising:
- discharging the internal capacitor;
- charging the internal capacitor with an output current of the common current source;
- monitoring if a voltage level on a terminal of the internal capacitor has reached a reference voltage by means of the common monitoring device;
- measuring a first period of time until the voltage level has reached the reference voltage;
- discharging the external capacitor;
- charging the external capacitor with the output current of the current source;
- monitoring if a voltage level on a terminal of the external capacitor has reached the reference voltage by means of the monitoring device;
- measuring a second period of time until the voltage level has reached the reference voltage; and
- obtaining a capacitance ratio of the internal capacitor and of the external capacitor based on the first period of time and the second period of time.

17. The method according to claim 16, wherein the capacitance ratio is calculated as a ratio of the first period of time and the second period of time.

18. The method according to claim 14, further comprising:
- adjusting the internal capacitor to a nominal value based on a calibration result.

19. The method according to claim 14, further comprising:
- obtaining the frequency information signal further based on a calibration result.

20. The method according to claim 14, further comprising:
- adjusting components of the bridge circuit based on the calibration result.

21. The method according to claim 14, wherein the external capacitor is a supply capacitor coupled to a supply input of the integrated circuit.

22. The method according to claim 10, further comprising:
- selecting a mode of operation of the integrated circuit based on the frequency information signal.

23. An electronic device, comprising:
a clock signal source; and
an integrated circuit having a clock signal input coupled to the clock signal source to receive an input clock signal, the integrated circuit comprising:
a first switched capacitor element;
a second switched capacitor element;
the first switched capacitor element and the second switched capacitor element being coupled to form a bridge circuit, the first switch capacitor element being located in a first branch of the bridge circuit, and the second switch capacitor element being located in a second branch of the bridge circuit; and
a detector circuit coupled to the first branch and to the second branch of the bridge circuit, wherein
the detector is configured to discriminate between at least a first frequency of the input clock signal and a second frequency of the input clock signal and to generate a corresponding frequency information signal, and
the frequency information signal is based on a first voltage level in the first branch of the bridge circuit and a second voltage level in the second branch of the bridge circuit;
wherein the clock signal input of the integrated circuit is coupled to the first switched capacitor element to obtain switching signals of the first switched capacitor element and of the second switched capacitor element based on the input clock signal applied to the clock signal input.

24. The electronic device according to claim 23, wherein the integrated circuit is configured to select its mode of operation based on the frequency information signal.

25. The electronic device according to claim 23, wherein the electronic device is a communication device and the integrated circuit implements communication functions.

* * * * *